(12) United States Patent
Kang et al.

(10) Patent No.: US 12,416,839 B2
(45) Date of Patent: Sep. 16, 2025

(54) DISPLAY PANEL

(71) Applicant: HannStar Display Corporation, Taipei (TW)

(72) Inventors: Mu-Kai Kang, Tainan (TW);
Cheng-Yen Yeh, Taichung (TW);
Sz-Kai Huang, Taichung (TW);
Jing-Xuan Chen, Tainan (TW);
Yen-Chung Chen, Taichung (TW)

(73) Assignee: HannStar Display Corporation, Taipei (TW)

( * ) Notice: Subject to any disclaimer, the term of this patent is extended or adjusted under 35 U.S.C. 154(b) by 397 days.

(21) Appl. No.: 18/297,016

(22) Filed: Apr. 7, 2023

(65) Prior Publication Data

US 2023/0375890 A1    Nov. 23, 2023

(30) Foreign Application Priority Data

May 18, 2022   (CN) .......................... 202210548122.9

(51) Int. Cl.
*G02F 1/1362* (2006.01)
*H10D 86/40* (2025.01)
*H10D 86/60* (2025.01)

(52) U.S. Cl.
CPC ..... *G02F 1/136286* (2013.01); *H10D 86/441* (2025.01); *H10D 86/60* (2025.01)

(58) Field of Classification Search
CPC . G02F 1/136286; H10D 86/441; H10D 86/60
See application file for complete search history.

(56) References Cited

U.S. PATENT DOCUMENTS

2023/0112631 A1*   4/2023   Yoshino .............. H10D 86/441
                                                  257/59

* cited by examiner

*Primary Examiner* — Peter M Albrecht
(74) *Attorney, Agent, or Firm* — CKC & Partners Co., LLC

(57) ABSTRACT

A display panel includes a substrate, pixels, gate lines, a gate connecting line, a common line and a compensation electrode. The pixels are disposed on the substrate. The gate lines are disposed on the substrate and are configured to receive scan signals. The number of pixels coupled to a first gate line of the gate lines is less that the number of pixels coupled to a second gate line of the gate lines. The gate connecting line is electrically connected to the first gate line. The common line is disposed under the gate connecting line, and is configured to receive a common voltage signal. The compensation electrode is disposed over the gate connecting line, and is configured to receive the common voltage signal. The common line, the gate connecting line and the compensation electrode are overlapped.

11 Claims, 8 Drawing Sheets

DISPLAY PANEL

RELATED APPLICATIONS

This application claims priority to Chinese Application Serial Number 202210548122.9 filed May 18, 2022, which is herein incorporated by reference.

BACKGROUND

Field of Invention

The invention relates to a display panel, and more particularly to a display panel which has a free-shaped active area.

Description of Related Art

In recent times, with the development of display panel manufacturing technologies, high definition display panels have been already applied to wearable and handheld electronic devices, such as smartwatches and health wristbands. Furthermore, the aesthetic demands that consumers place on electronic devices are increasing, and thus display panels with particular appearances are applied to electronic devices. Display panels of these electronic devices often have non-rectangular shapes, such as a circular shape or another irregular shape. However, for such display panels, the numbers of pixels respectively in the pixel rows in the active area are not identical, such that the loads of the pixel rows are not identical, resulting in a significant brightness difference at various areas of the display panel and ultimately causing problems such as poor grayscale display performance.

SUMMARY

The objective of the invention is to provide a display panel which has a free-shaped active area and includes a load compensation function for the gate lines thereof, so as to improve problems such as poor grayscale display performance.

According to the above objective, the invention provides a display panel which has an active area and a peripheral area and includes a substrate, plural pixels, plural gate lines, a gate connecting line, a common line and a compensation electrode. The pixels are disposed on the substrate and in the active area. The gate lines are disposed on the substrate and are configured to receive scan signals. Each gate line is coupled to one or more of the pixels; a number of pixels coupled to a first gate line of the gate lines is less that a number of pixels coupled to a second gate line of the gate lines, and the first gate line crosses the active area and the peripheral area. The gate connecting line is in the peripheral area and electrically connected to the first gate line. The common line is in the peripheral area and disposed under the gate connecting line, and is configured to receive a common voltage signal. The compensation electrode is in the peripheral area and disposed over the gate connecting line, and is configured to receive the common voltage signal. The common line, the gate connecting line and the compensation electrode are overlapped in a normal direction of the display panel.

In accordance with one embodiment of the invention, the display panel further includes a bridge structure which is in the peripheral area and directly connects the first gate line and the gate connecting line.

In accordance with another embodiment of the invention, each pixel includes a pixel electrode and a common electrode. The common electrode is disposed over the pixel electrode, and the common electrode, the bridge structure and the compensation electrode belong to the same transparent conductive layer.

In accordance with another embodiment of the invention, the display panel further includes a compensation wiring. The compensation wiring is in the peripheral area and disposed over the compensation electrode, and is configured to receive the same scan signal as the first gate line. The common line, the gate connecting line, the compensation electrode and the compensation wiring are overlapped in the normal direction of the display panel.

In accordance with another embodiment of the invention, the compensation wiring directly connects the bridge structure and the gate connecting line.

In accordance with another embodiment of the invention, each pixel includes a pixel electrode and a common electrode. The common electrode is disposed under the pixel electrode, and the common electrode and the compensation electrode belong to the same transparent conductive layer.

In accordance with another embodiment of the invention, a width of the common line is greater than a width of the gate connecting line.

In accordance with another embodiment of the invention, the active area is free-shaped and has a first subarea and a second subarea. The first subarea and the second subarea area are opposite to each other and have a gap therebetween, and the common line and the gate connecting line are disposed in the gap.

According to the above objective, the invention provides a display panel which has an active area and a peripheral area and includes a substrate, plural pixels, plural gate lines, a common line, a compensation wiring and a compensation electrode. The pixels are disposed on the substrate and in the active area. The gate lines are disposed on the substrate and configured to receive a plurality of scan signals. Each gate line is coupled to one or more of the pixels; a number of pixels coupled to a first gate line of the gate lines is less that a number of pixels coupled to a second gate line of the gate lines, and the first gate line crosses the active area and the peripheral area. The common line is disposed over the first gate line and in the peripheral area, and is configured to receive a common voltage signal. The compensation wiring is disposed over the common line, and is configured to receive the same scan signal as the first gate line. The compensation electrode is disposed over the compensation wiring, and is configured to receive the common voltage signal. The first gate line, the common line, the compensation wiring and the compensation electrode are overlapped in a normal direction of the display panel.

In accordance with another embodiment of the invention, the display panel further includes a bridge structure which is in the peripheral area and directly connects the first gate line and the compensation wiring.

In accordance with another embodiment of the invention, each pixel includes a pixel electrode and a common electrode. The common electrode is disposed under the pixel electrode, and the pixel electrode, the bridge structure and the compensation electrode belong to the same transparent conductive layer.

The invention has at least the advantages of providing a load compensation function for the gate lines thereof and therefore can improve problems such as poor grayscale display performance.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
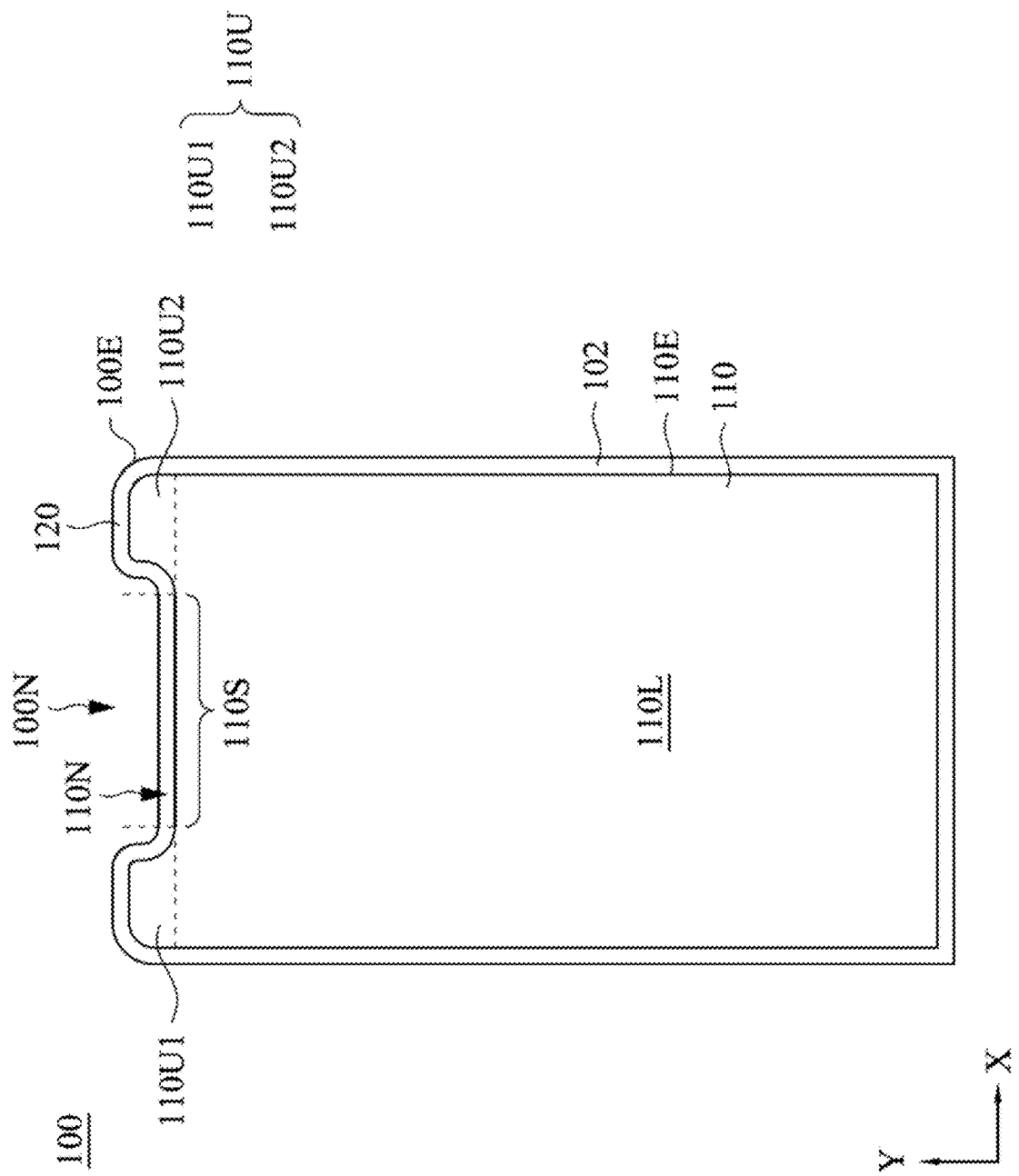
FIG. 1 is a schematic diagram of a display panel.

Specific embodiments of the present invention are further described in detail below with reference to the accompanying drawings. However, the embodiments described are not intended to limit the present invention and it is not intended for the description of operation to limit the order of implementation.

Terms used herein are only used to describe the specific embodiments, which are not used to limit the claims appended herewith. Unless limited otherwise, the term "a," "an," "one" or "the" of the single form may also represent the plural form.

It will be understood that, although the terms "first," "second," etc., may be used herein to describe various features, these features should not be limited by these terms. These terms are only used to distinguish one feature from another feature.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The document may repeat reference numerals and/or letters in the various examples. This repetition is for the purpose of simplicity and clarity and does not in itself dictate a relationship between the various embodiments and/or configurations discussed.

In addition, in order to simplify the accompanying drawings, some conventional structures and elements are shown in a simple schematic manner or are not shown in the accompanying drawings, and the actual size and proportion of each component in this context are not limited to the content shown in the accompanying drawings.

FIG. 1 is a schematic diagram of a display panel 100. The display panel 100 may be, for example, a liquid crystal display of twisted nematic (TN) type, in-plane switching (IPS) type, fringe-field switching (FFS) type, vertical alignment (VA) type, reflective type or transflective type, but is not limited thereto.

The display panel 100 includes a substrate 102 and has an active area 110 and a peripheral area 120 that surrounds the active area 110. Plural pixels (not shown in FIG. 1) arranged along the directions X and Y to form a pixel array are disposed on the substrate 102 and in the active area 110. The display panel 100 is a free-shaped display panel. As shown in FIG. 1, the display panel 100 has a free-shaped edge 100E and a notch 100N at the top thereof; correspondingly, the active area 110 also has a free-shaped edge 110E and a notch 110N at the top thereof. The active area 110 includes a regular area 110L (e.g., a rectangular region) and an irregular area 110U. If the sizes of the pixels in the active area 110 are substantially identical, then in the regular area 110L of the active area 110, the numbers of pixels respectively in the pixel rows are identical, while the irregular area 110U of the active area 110 includes subareas 110U1 and 110U2 that are opposite to each other and respectively at the upper-left and upper-right sides of the active area 110, and a gap 110S is present between the subareas 110U1 and 110U2.

Figure 2:
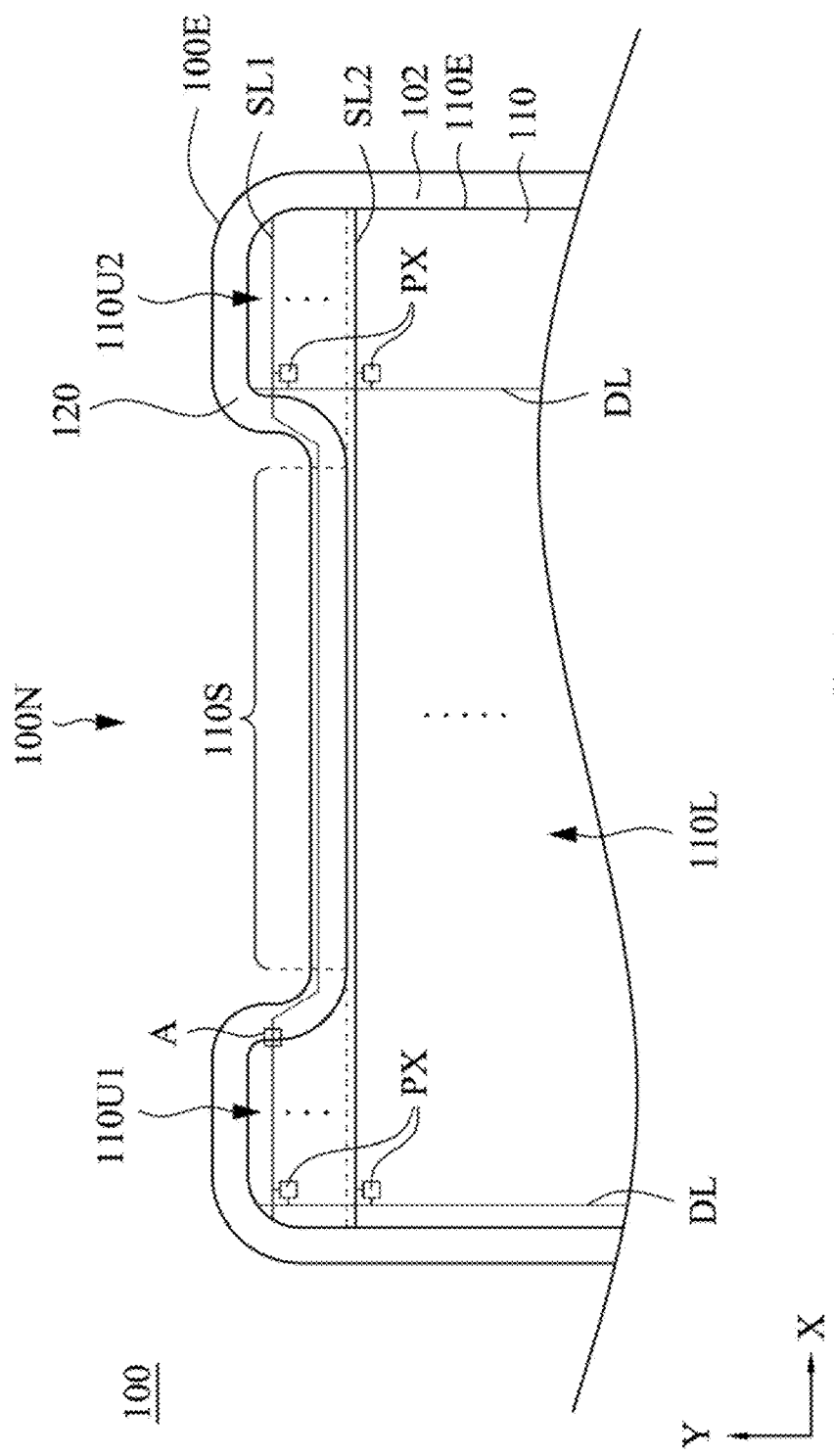
FIG. 2 is an enlarged schematic diagram of an upper side of the display panel shown in FIG. 1.

FIG. 2 is an enlarged schematic diagram of the upper side of the display panel 100 shown in FIG. 1. As shown in FIG. 2, the substrate 102 has pixels PX, gate lines SL1, SL2 and a data line DL disposed thereon. Each pixel PX includes a thin-film transistor electrically connected to a gate line (the gate line SL1 or the gate line SL2) and a data line DL for receiving a scan signal and a data signal to correspondingly display a grayscale. For convenience of description, FIG. 2 only illustrates a part of the pixels PX, the gate lines SL1 and SL2 and the data line DL. The pixels PX in the same pixel row and respectively in the subareas 110U1, 110U2 are electrically connected to the same gate line SL1, and each gate line SL1 crosses the subarea 110U1, the gap 110S and the subarea 110U2. As shown in FIG. 2, there is no pixel PX in the gap 110S, and thus the number of pixels coupled to the gate line SL1 is less than the number of pixels coupled to the gate line SL2.

Figure 3A:
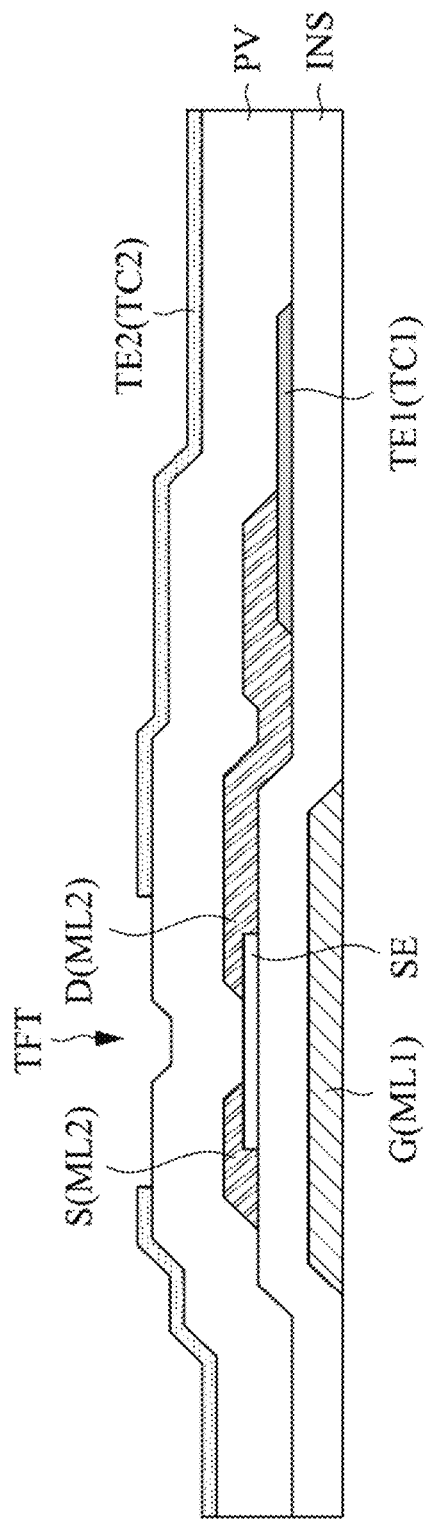
FIGS. 3A and 3B are cross-sectional diagrams of a pixel shown in FIG. 2 in accordance with various examples.

FIG. 3A is a cross-sectional diagram of one of the pixels PX shown in FIG. 2 in accordance with an example. As shown in FIG. 3A, the pixel PX includes a thin-film transistor TFT, a first transparent electrode TE1 and a second transparent electrode TE2, in which the thin-film transistor TFT has a gate electrode G, a semiconductor layer SE, a source electrode S and a drain electrode D, and the second transparent electrode TE2 is disposed over the first transparent electrode TE1. The gate electrode G is a portion of a first metal layer ML1, the source electrode S and the drain electrode D are portions of a second metal layer ML2, and a gate insulating layer INS is interposed between the first metal layer ML1 and the second metal layer ML2. The first transparent electrode TE1 is electrically connected to the drain electrode D, and a passivation layer PV is interposed between the first transparent electrode TE1 and the second transparent electrode TE2. The first transparent electrode TE1 and the second transparent electrode TE2 are a pixel electrode and a common electrode, respectively, and thus the structure shown in FIG. 3A is a top common electrode structure, i.e., the common electrode is disposed over the pixel electrode.

Figure 3B:
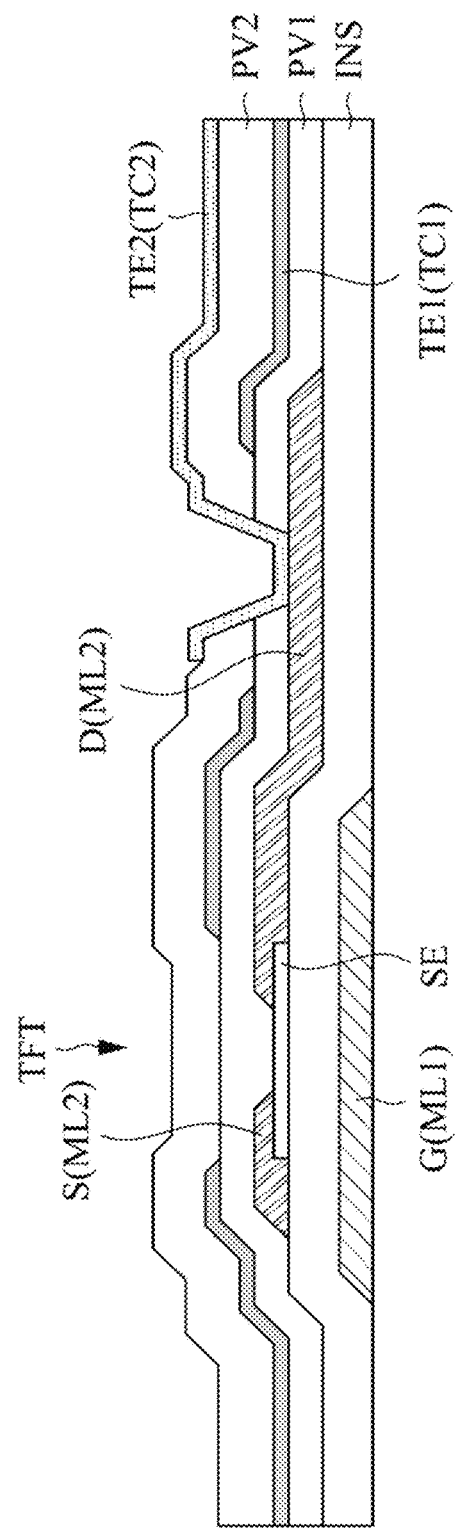

FIG. 3B is a cross-sectional diagram of one of the pixels PX shown in FIG. 2 in accordance with another example. As shown in FIG. 3B, the pixel PX includes a thin-film transistor TFT, a first transparent electrode TE1 and a second transparent electrode TE2, in which the thin-film transistor TFT has a gate electrode G, a semiconductor layer SE, a source electrode S and a drain electrode D, and the second transparent electrode TE2 is disposed over the first transparent electrode TE1. The gate electrode G is a portion of a first metal layer ML1, the source electrode S and the drain electrode D are portions of a second metal layer ML2, and a gate insulating layer INS is between the first metal layer ML1 and the second metal layer ML2. A passivation layer PV1 is between the second metal layer ML2 and the first transparent electrode TE1, a passivation layer PV2 is between the first transparent electrode TE1 and the second transparent electrode TE2, and the second transparent electrode TE2 penetrates through the passivation layers PV1 and PV2 to be electrically connected to the drain electrode D. The first transparent electrode TE1 and the second transparent electrode TE2 are respectively the common electrode and the pixel electrode, and thus the structure shown in FIG. 3B is a top pixel electrode structure, i.e., the common electrode is disposed under the pixel electrode.

However, as to the display panel 100 having the active area 110 with an irregular shape, the number of pixels coupled to the gate line SL1 is different from the number of pixels coupled to the gate line SL2 and thus, if a compensation is not performed on the gate line SL1 coupled to relatively fewer pixels PX, then the resistive-capacitive load of the gate line SL1 is different from the resistive-capacitive load of the gate line SL2, resulting in the brightness difference between the subareas 110U1 and 110U2 and the regular area 110L and thus causing poor grayscale display performance. In the following description, several embodiments are provided for compensating for the resistive-capacitive load of the gate line SL1, such that the resistive-capacitive loads of the gate line SL1 and the gate line SL2 are close to uniformity, thereby solving the problem of poor grayscale display performance.

Figure 4A:
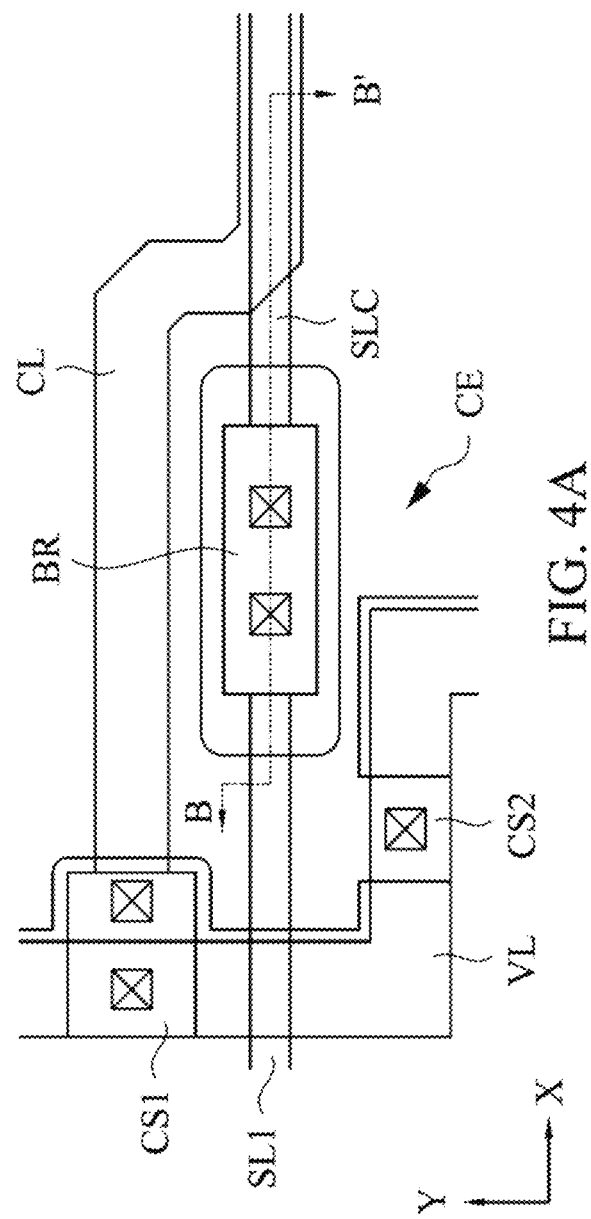
FIG. 4A is a part of the layout diagram of the display panel shown in FIG. 2 in accordance with a first embodiment of the invention.

FIG. 4A is a part of the layout diagram of the display panel 100 shown in FIG. 2 in accordance with a first embodiment of the invention. The layout area shown in FIG. 4A may be the area A in FIG. 2A. A voltage potential line VL may be at a boundary area between the active area 110 and the peripheral area 120, and is used to provide a common voltage signal to the common electrode of each pixel PX. The gate line SL1 crosses the active area 110 and the peripheral area 120, and a bridge structure BR directly connects the gate line SL1 and a gate connecting line SLC in the peripheral area 120, such that the gate line SL1 is electrically connected to the gate connecting line SLC via the bridge structure BR. A common line CL is at the peripheral area 120, and is electrically connected to the voltage potential line VL via a connecting structure CS1, such that the voltage potential line VL provides the common voltage signal to the common line CL via the connecting structure CS1. A compensation electrode CE is at the peripheral area 120 and electrically insulated from the gate line SL1 and the gate connecting line SLC, and is electrically connected to the voltage potential line VL via a connecting structure CS2, such that the voltage potential line VL provides the common voltage signal to the compensation electrode CE via the connecting structure CS2.

Figure 4B:
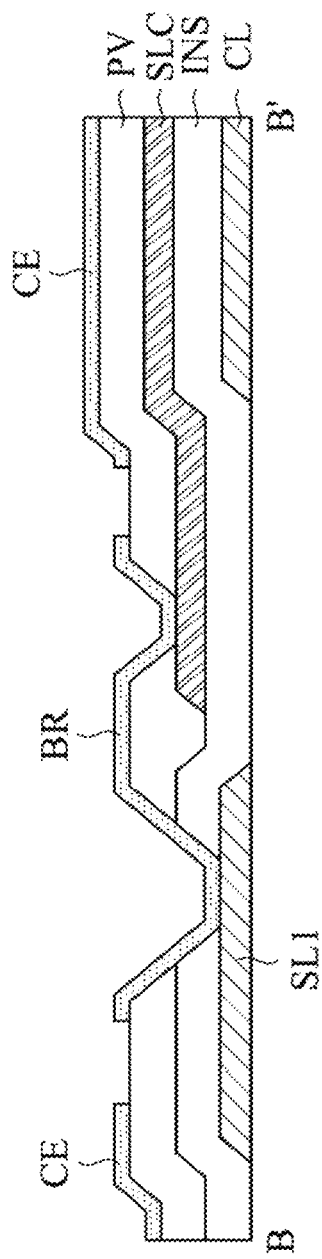
FIG. 4B is a cross-sectional diagram along the section line B-B' of the layout area shown in FIG. 4A.

FIG. 4B is a cross-sectional diagram along the section line B-B' of the layout area shown in FIG. 4A. The cross-sectional diagram shown in FIG. 4B corresponds to the pixel structure shown in FIG. 3A. Referring to FIG. 3A and FIG. 4B simultaneously, the common line CL and the compensation electrode CE are respectively over and under the gate connecting line SLC. All the gate electrode G, the gate line SL1 and the common line CL belong to the first metal layer ML1, all the source electrode S, the drain electrode D and the gate connecting line SLC belong to the second metal layer ML2, and all the second transparent electrode TE2, the bridge structure BR and the compensation electrode CE belong to the second transparent conductive layer TC2. The material of the second transparent conductive layer TC2 may be indium tin oxide (ITO), indium zinc oxide (IZO) or another suitable transparent conductive material. The common line CL and the gate connecting line SLC are disposed in the gap 110S.

The common line CL, the gate connecting line SLC and the compensation electrode CE are overlapped in the normal direction of the display panel 100, such that parasitic capacitances are generated respectively between the gate connecting line SLC and the common line CL and between the gate connecting line SLC and the compensation electrode CE. As such, the capacitive load of the gate line SL1 can be increased, such that the capacitive loads of the gate lines SL1 and SL2 are close to uniformity. Further, as shown in FIGS. 4A and 4B, the width of the common line CL may be greater than the width of the gate connecting line SLC, so as to avoid the varying overlapped area of the common line CL and the gate connecting line SLC due to the manufacturing process variations of the first metal layer ML1 and the second metal layer ML2, thereby preventing the parasitic capacitance between the gate connecting line SLC and the common line CL from drifting.

Figure 5A:
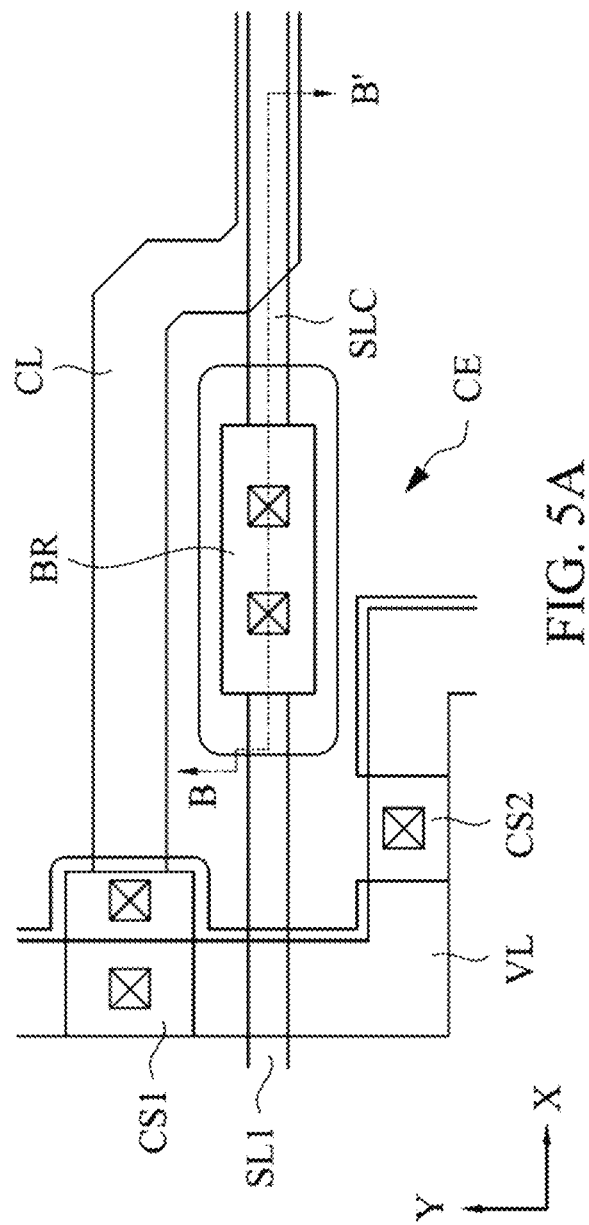
FIG. 5A is a part of the layout diagram of the display panel shown in FIG. 2 in accordance with a second embodiment of the invention.

FIG. 5A is a part of the layout diagram of the display panel 100 shown in FIG. 2 in accordance with a second embodiment of the invention. The layout area shown in FIG. 5A may be the area A shown in FIG. 2. The layout diagram shown in FIG. 5A is approximately the same as the content shown in FIG. 4A, and reference may be made to the aforementioned description for FIG. 4A and related descriptions will not be repeated herein.

Figure 5B:
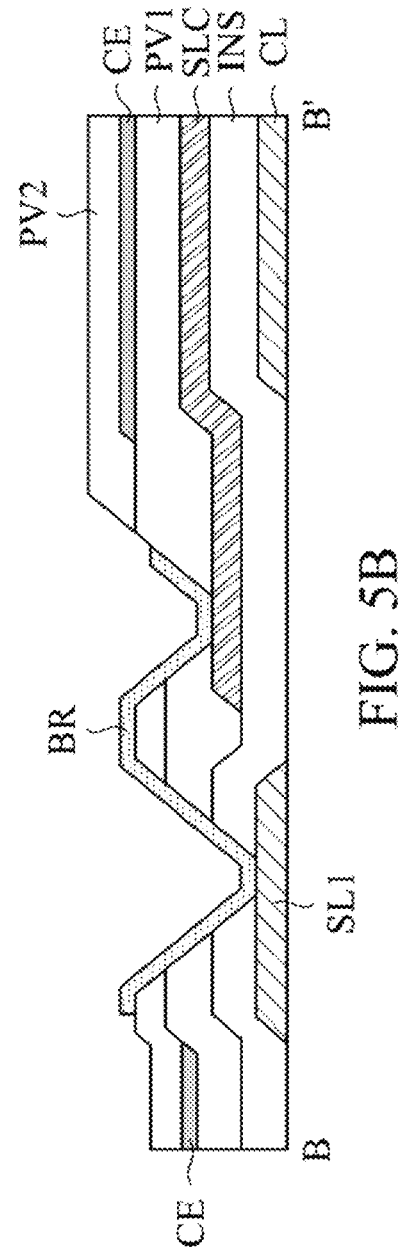
FIG. 5B is a cross-sectional diagram along the section line B-B' of the layout area shown in FIG. 5A.

FIG. 5B is a cross-sectional diagram along the section line B-B' of the layout area shown in FIG. 5A. The cross-sectional diagram shown in FIG. 5B corresponds to the pixel structure shown in FIG. 3B, and referring simultaneously to FIG. 3B and FIG. 5B, the common line CL and the compensation electrode CE are disposed respectively under and over the gate connecting line SLC; all the gate electrode G, the gate line SL1 and the common line CL belong to the first metal layer ML1; all the source electrode S, the drain electrode D and the gate connecting line SLC belong to the second metal layer ML2; both the first transparent electrode TE1 and the compensation electrode CE belong to the first transparent conductive layer TC1; and both the second transparent electrode TE2 and the bridge structure BR belong to the second transparent conductive layer TC2. The second transparent conductive layer TC2 may be ITO, IZO or another suitable transparent conductive material. The common line CL and the gate connecting line SLC are disposed in the gap 110S.

Similar to the first embodiment, in the second embodiment, the common line CL, the gate connecting line SLC and the compensation electrode CE are overlapped in the normal direction of the display panel 100, and the width of the common line CL may be greater than the width of the gate connecting line SLC. Similarly, the width of the compensation electrode CE may be greater than the width the gate connecting line SLC, so as to avoid the varying overlapped area of the gate connecting line SLC and the compensation electrode CE due to the manufacturing process variations of the second metal layer ML2 and the first transparent conductive layer TC1, thereby preventing the parasitic capacitance between the gate connecting line SLC and the compensation electrode CE from drifting.

Figure 6A:
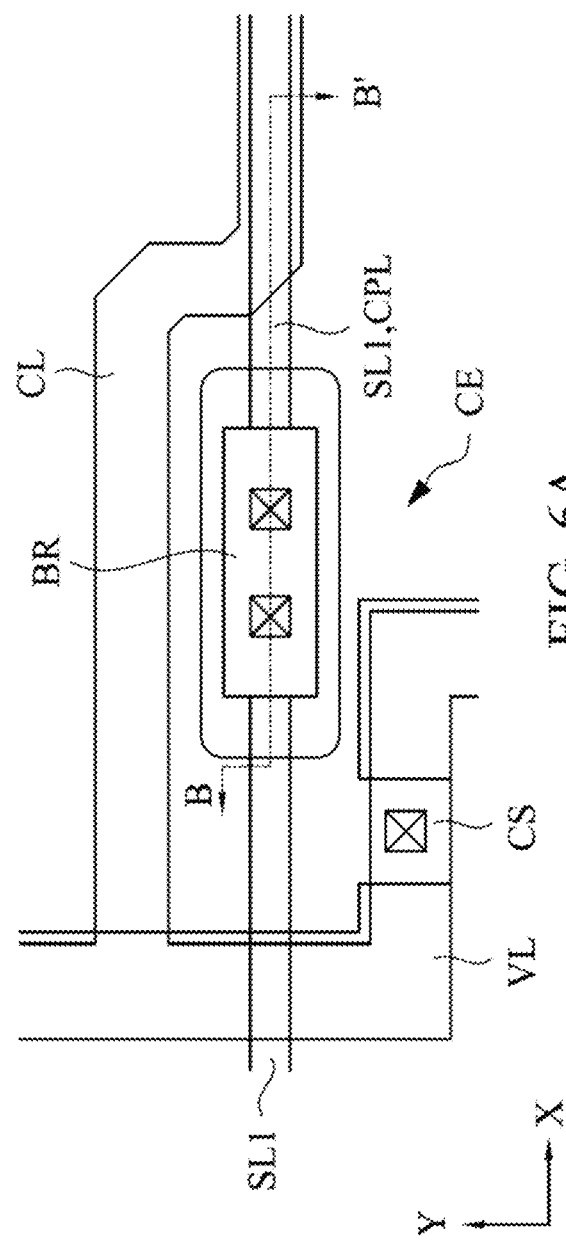
FIG. 6A is a part of the layout diagram of the display panel shown in FIG. 2 in accordance with a third embodiment of the invention.

FIG. 6A is a part of the layout diagram of the display panel 100 shown in FIG. 2 in accordance with a third embodiment of the invention. The layout area shown in FIG. 6A may be the area A shown in FIG. 2. The difference between the layout diagram shown in FIG. 6A and the layout diagram shown in FIG. 4A is that in FIG. 6A, the bridge structure BR directly connects the gate line SL1 and a compensation wiring CPL in the peripheral area 120, such that the gate line SL1 is electrically connected to the compensation wiring CPL via the bridge structure BR. In addition, as shown in FIG. 6A, the gate line SL1 and the compensation wiring CPL extend along the direction X together; the compensation electrode CE is at the peripheral area 120 and electrically insulated from the gate line SL1 and the compensation wiring CPL, and is electrically connected to the voltage potential line VL via the connecting structure CS, such that the voltage potential line VL provides the common voltage signal to the compensation electrode CE via the connecting structure CS. Other aspects of this embodiment are approximately the same as those shown in FIG. 4A, and thus reference may be made to the aforementioned description for FIG. 4A and related descriptions will not be repeated herein.

Figure 6B:
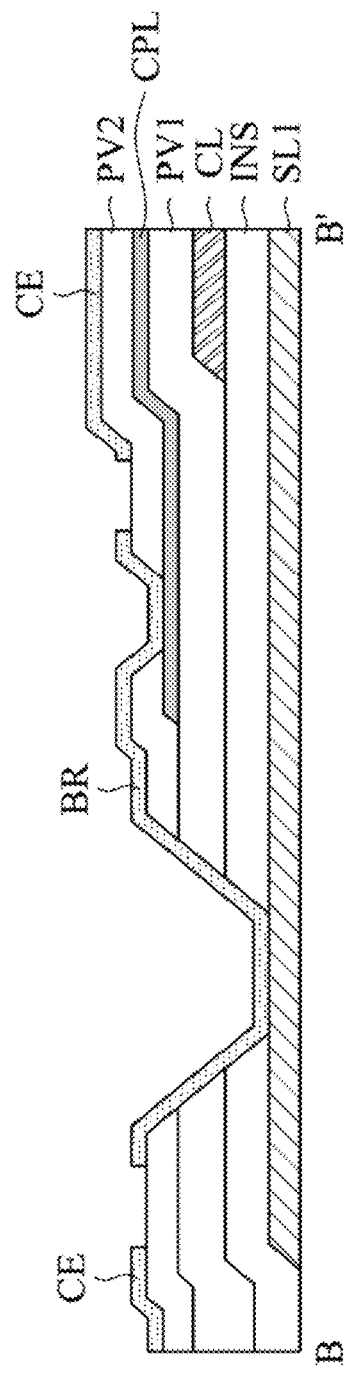
FIG. 6B is a cross-sectional diagram along the section line B-B' of the layout area shown in FIG. 6A.

FIG. 6B is a cross-sectional diagram along the section line B-B' of the layout area shown in FIG. 6A. The cross-sectional diagram shown in FIG. 6B corresponds to the pixel structure shown in FIG. 3B. Referring to FIG. 3B and FIG. 6B simultaneously, the common line CL and the compensation electrode CE are disposed respectively under and over the compensation wiring CPL; both the gate electrode G and the gate line SL1 belong to the first metal layer ML1; all the source electrode S, the drain electrode D and the common line CL belong to the second metal layer ML2; both the first transparent electrode TE1 and the compensation wiring CPL belong to the first transparent conductive layer TC1; and all the second transparent electrode TE2, the bridge structure BR and the compensation electrode CE belong to the second transparent conductive layer TC2. The common line CL and the compensation wiring CPL are disposed in the gap 110S.

The gate line SL1, the common line CL, the compensation wiring CPL and the compensation electrode CE are overlapped in the normal direction of the display panel 100, such that parasitic capacitances are generated respectively between the gate line SL1 and the common line CL, between the common line CL and the compensation wiring CPL, and between the compensation wiring CPL and the compensation electrode CE. As such, the capacitive load of the gate line SL1 can be increased, such that the capacitive loads of the gate line SL1 and the gate line SL2 are close to uniformity. Further, as shown in FIGS. 6A and 6B, the width of the common line CL may be greater than the width of the gate line SL1 and the width of the compensation wiring CPL, so as to avoid the varying overlapped area of the gate line SL1, the common line CL and the compensation wiring CPL due to the manufacturing process variations of the first metal layer ML1, the second metal layer ML2 and the first transparent conductive layer TC1, thereby preventing the parasitic capacitances respectively between the gate line SL1 and the common line CL and between the common line CL and the compensation wiring CPL from drifting.

Figure 7A:
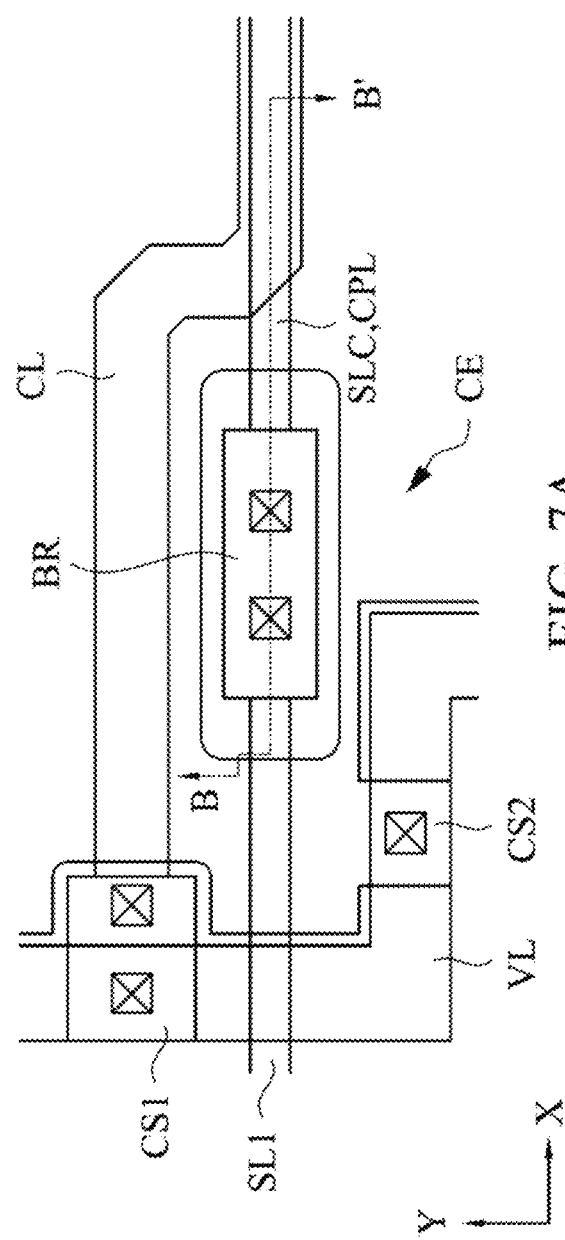
FIG. 7A is a part of the layout diagram of the display panel shown in FIG. 2 in accordance with a fourth embodiment of the invention.

FIG. 7A is a part of the layout diagram of the display panel 100 shown in FIG. 2 in accordance with a fourth embodiment of the invention. The difference between the layout diagram shown in FIG. 7A and the layout diagram shown in FIG. 4A is that in FIG. 7A, the bridge structure BR is a portion of the compensation wiring CPL at the peripheral area 120. In addition, as shown in FIG. 7A, the compensation electrode CE is at the peripheral area 120 and electrically insulated from the gate connecting line SLC and the compensation wiring CPL, and is electrically connected to the voltage potential line VL via the connecting structure CS2, such that the voltage potential line VL provides the common voltage signal to the compensation electrode CE via the connecting structure CS2.

Figure 7B:
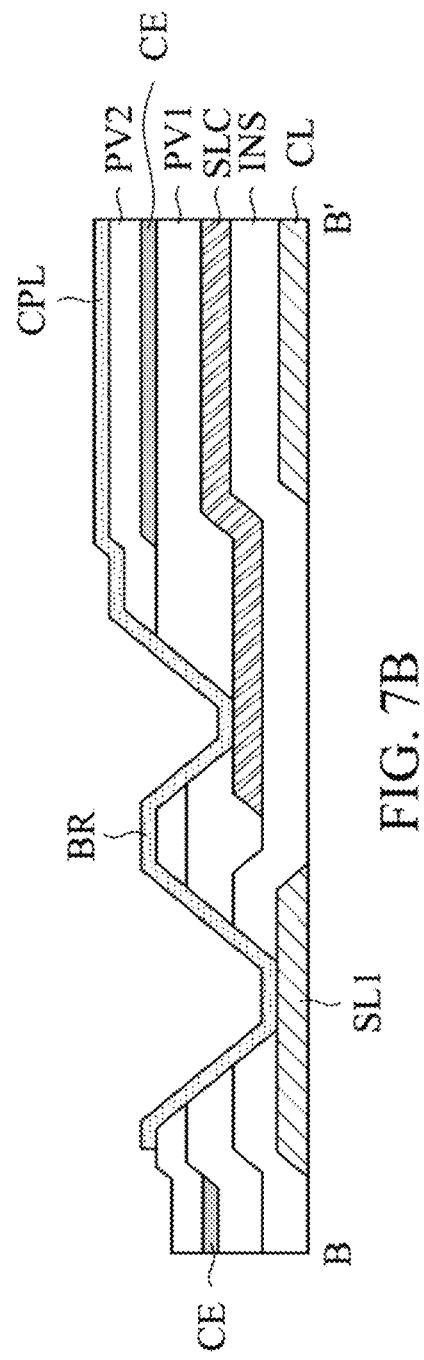
FIG. 7B is a cross-sectional diagram along the section line B-B' of the layout area shown in FIG. 7A.

FIG. 7B is a cross-sectional diagram along the section line B-B' of the layout area shown in FIG. 7A. The cross-sectional diagram shown in FIG. 7B corresponds to the pixel structure shown in FIG. 3B, and referring simultaneously to FIG. 3B and FIG. 7B, the common line CL and the compensation electrode CE are disposed respectively under and over the gate connecting line SLC; the compensation wiring CPL is disposed over the compensation electrode CE; all the gate electrode G, the gate line SL1 and the common line CL belong to the first metal layer ML1; all the source electrode S, the drain electrode D and the gate connecting line SLC belong to the second metal layer ML2; both the first transparent electrode TE1 and the compensation electrode CE belong to the first transparent conductive layer TC1; and all the second transparent electrode TE2, the bridge structure BR and the compensation wiring CPL belong to the second transparent conductive layer TC2. The common line CL, the gate connecting line SLC and the compensation wiring CPL are disposed in the gap 110S.

The common line CL, the gate connecting line SLC, the compensation electrode CE and the compensation wiring CPL are overlapped in the normal direction of the display panel 100, such that parasitic capacitances are generated respectively between the gate connecting line SLC and the common line CL, between the gate connecting line SLC and the compensation electrode CE, and between the compensation electrode CE and the compensation wiring CPL. As such, the capacitive load of the gate line SL1 can be increased, such that the resistive-capacitive loads of the gate line SL1 and the gate line SL2 are close to uniformity. Further, as shown in FIGS. 7A and 7B, the width of the common line CL may be greater than the width of the gate connecting line SLC, in order to avoid the varying overlapped area of the common line CL and the gate connecting line SLC due to the manufacturing process variations of the first metal layer ML1 and the second metal layer ML2, thereby preventing the parasitic capacitance between the gate connecting line SLC and the common line CL from drifting.

Figure 8:
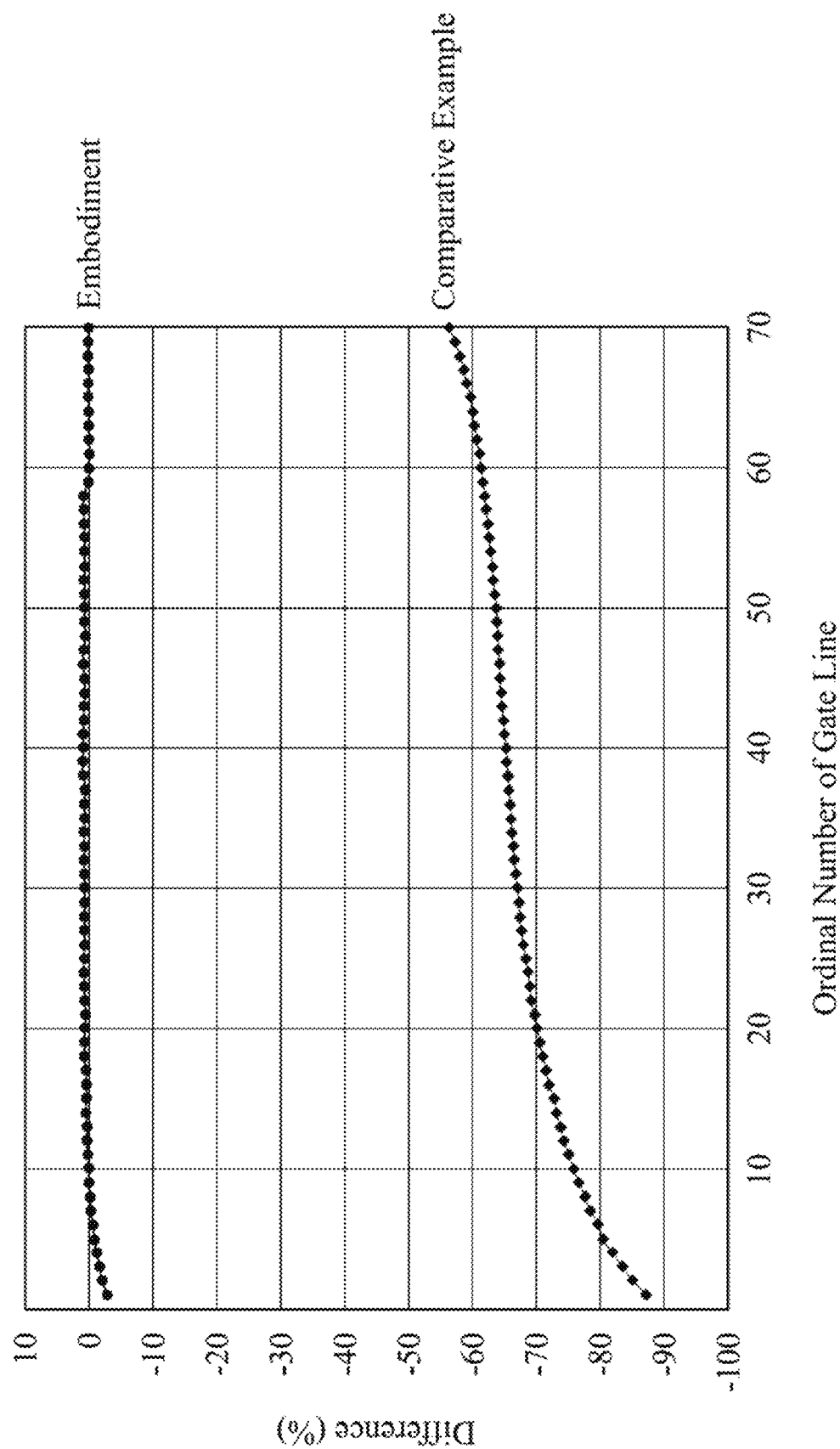
FIG. 8 is a line graph showing load differences of gate lines according to one embodiment of the invention and a comparative example.

FIG. 8 is a line graph showing load (capacitance impedance) differences of gate lines according to one embodiment of the invention and a comparative example, in which the line corresponding to the embodiment represents the resistive-capacitive load (capacitance impedance) differences between the gate lines in the regular area and the gate lines in the irregular area with the compensation structure design of the invention, while the line corresponding to the comparative example represents the resistive-capacitive load differences between the gate lines in the regular area and the gate lines in the irregular area without the compensation structure design of the invention. As shown in FIG. 8, for the comparative example, the resistive-capacitive load difference between the gate lines respectively in the irregular area and each gate line in the regular area decreases as the ordinal number increases (the uppermost gate line is the first gate line in the irregular area, and the ordinal number of the gate lines in the irregular area increases from top to bottom), but the resistive-capacitive load difference between the last gate line in the irregular area and each gate line in the regular area is still higher than 55%, while for the embodiment of the invention, the resistive-capacitive load difference between each gate line in the irregular area and each gate line in the regular area is less than 5%. It can be seen that the use of the compensation structure design proposed in the invention can greatly reduce the resistive-capacitive load differences between the gate lines in the irregular area and the gate lines in the regular area, making the resistive-capacitive loads of all the gate lines to be consistent, thereby improving the problem of poor grayscale display performance.

Although the invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel having an active area and a peripheral area and comprising:
   a substrate;
   a plurality of pixels disposed on the substrate and in the active area;
   a plurality of gate lines disposed on the substrate and configured to receive a plurality of scan signals, wherein each gate line is coupled to one or more of the pixels, wherein a number of pixels coupled to a first gate line of the gate lines is less than a number of pixels coupled to a second gate line of the gate lines, and wherein the first gate line crosses the active area and the peripheral area;
   a gate connecting line in the peripheral area and electrically connected to the first gate line;
   a common line in the peripheral area and disposed under the gate connecting line, the common line configured to receive a common voltage signal; and
   a compensation electrode in the peripheral area and disposed over the gate connecting line, the compensation electrode configured to receive the common voltage signal;
   wherein the common line, the gate connecting line and the compensation electrode are overlapped in a normal direction of the display panel.

2. The display panel of claim 1, further comprising:
   a bridge structure in the peripheral area and directly connecting the first gate line and the gate connecting line.

3. The display panel of claim 2, wherein each pixel comprises a pixel electrode and a common electrode, wherein the common electrode is disposed over the pixel electrode, and wherein the common electrode, the bridge structure and the compensation electrode belong to the same transparent conductive layer.

4. The display panel of claim 2, further comprising:
   a compensation wiring in the peripheral area and disposed over the compensation electrode, the compensation wiring configured to receive the same scan signal as the first gate line;
   wherein the common line, the gate connecting line, the compensation electrode and the compensation wiring are overlapped in the normal direction of the display panel.

5. The display panel of claim 4, wherein the compensation wiring directly connects the bridge structure and the gate connecting line.

6. The display panel of claim 1, wherein each pixel comprises a pixel electrode and a common electrode, wherein the common electrode is disposed under the pixel electrode, and wherein the common electrode and the compensation electrode belong to the same transparent conductive layer.

7. The display panel of claim 1, wherein a width of the common line is greater than a width of the gate connecting line.

8. The display panel of claim 1, wherein the active area is free-shaped and has a first subarea and a second subarea, wherein the first subarea and the second subarea are opposite to each other and have a gap therebetween, and wherein the common line and the gate connecting line are disposed in the gap.

9. A display panel having an active area and a peripheral area and comprising:
   a substrate;
   a plurality of pixels disposed on the substrate and in the active area;
   a plurality of gate lines disposed on the substrate and configured to receive a plurality of scan signals, wherein each gate line is coupled to one or more of the pixels, wherein a number of pixels coupled to a first gate line of the gate lines is less than a number of pixels coupled to a second gate line of the gate lines, and wherein the first gate line crosses the active area and the peripheral area;
   a common line disposed over the first gate line and in the peripheral area, the common line configured to receive a common voltage signal;
   a compensation wiring disposed over the common line, the compensation wiring configured to receive the same scan signal as the first gate line; and
   a compensation electrode disposed over the compensation wiring, the compensation electrode configured to receive the common voltage signal;
   wherein the first gate line, the common line, the compensation wiring and the compensation electrode are overlapped in a normal direction of the display panel.

10. The display panel of claim 9, further comprising:
    a bridge structure in the peripheral area and directly connecting the first gate line and the compensation wiring.

11. The display panel of claim 10, wherein each pixel comprises a pixel electrode and a common electrode, wherein the common electrode is disposed under the pixel electrode, and wherein the pixel electrode, the bridge structure and the compensation electrode belong to the same transparent conductive layer.

* * * * *